United States Patent
Yamada

(10) Patent No.: US 6,387,796 B1
(45) Date of Patent: May 14, 2002

(54) SEMICONDUCTOR DEVICE AND METHOD OF MANUFACTURING THE SAME

(75) Inventor: Shigeru Yamada, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/707,846

(22) Filed: Nov. 8, 2000

Related U.S. Application Data

(62) Division of application No. 09/241,402, filed on Feb. 2, 1999, now Pat. No. 6,175,153.

(30) Foreign Application Priority Data

Aug. 18, 1998 (JP) ............................................ 10-231373

(51) Int. Cl.⁷ .............................................. H01L 21/44
(52) U.S. Cl. ........................ 438/614; 438/110; 438/122; 438/622
(58) Field of Search ................................ 438/110, 118, 438/122, 124, 108, 121, 125, 612–614, 622, 761

(56) References Cited

U.S. PATENT DOCUMENTS

| | | | | |
|---|---|---|---|---|
| 5,362,656 A | | 11/1994 | McMahon | 29/827 |
| 5,679,978 A | * | 10/1997 | Kawahara et al. | 257/697 |
| 5,858,815 A | * | 1/1999 | Heo et al. | 438/112 |
| 5,976,974 A | * | 11/1999 | Fischer et al. | 438/667 |
| 5,990,546 A | | 11/1999 | Igarashi et al. | 257/700 |
| 6,087,203 A | * | 7/2000 | Eng et al. | 438/106 |

FOREIGN PATENT DOCUMENTS

JP        9-223759        8/1997

* cited by examiner

Primary Examiner—Carl Whitehead, Jr.
Assistant Examiner—Jamie L. Brophy
(74) Attorney, Agent, or Firm—Volentine Francos, PLLC

(57) ABSTRACT

A semiconductor device having a multilayer structure and a method of manufacturing the semiconductor device are disclosed. The semiconductor device according to the present invention has a semiconductor element including pad electrodes formed on the electrode area thereof, a first insulation layer formed on the circuit formation area of the semiconductor element, and a first circuit pattern formed on said first insulation layer. The first circuit pattern electrically connected to the pad electrodes. The semiconductor device of the present invention further has a second insulation layer formed on the first circuit pattern including a first through hole for exposing the first circuit pattern, and a second circuit pattern formed on the second insulation layer. The second circuit pattern is electrically connected to the pad electrodes and has a second through hole for exposing the first circuit pattern. The semiconductor device of the present invention further has first external electrodes electrically connected to said second circuit pattern and second external electrodes electrically connected to the first circuit pattern through the first and second through holes.

11 Claims, 5 Drawing Sheets

SEMICONDUCTOR DEVICE AND METHOD OF MANUFACTURING THE SAME

CROSS REFERENCE TO RELATED APPLICATIONS

This is a divisional application of application Ser. No. 09/241,402, filed Feb. 2, 1999, U.S. Pat. No. 6,175,153 which is hereby incorporated by reference in its entirety for all purposes.

BACKGROUND OF THE INVENTION

The present invention relates to a structure of a semiconductor device and a method of manufacturing the semiconductor device.

A background technology of the present invention is disclosed, for example, in Japanese Laid-open Patent No. 9-223759.

According to the disclosure in the above patent, a solder bump can be formed just on an electrode in a good condition by melting a solder ball directly put on the electrode. However, the disclosed semiconductor device can not get a sufficient characteristic because a common plane can not be formed. Further, the disclosed semiconductor device can not get a sufficient heat radiation efficiency because heat only radiates from the back side of the semiconductor device.

SUMMARY OF THE INVENTION

It is an object of the present invention to provide a semiconductor device having a good characteristic and a good heat radiation efficiency.

In order to accomplish the foregoing object, a semiconductor device according to the present invention has a semiconductor element including pad electrodes formed on the electrode area thereof, a first insulation layer formed on the circuit formation area of the semiconductor element, and a first circuit pattern formed on said first insulation layer. The first circuit pattern electrically connected to the pad electrodes. The semiconductor device of the present invention further has a second insulation layer formed on the first circuit pattern including a first through hole for exposing the first circuit pattern, and a second circuit pattern formed on the second insulation layer. The second circuit pattern is electrically connected to the pad electrodes and has a second through hole for exposing the first circuit pattern. The semiconductor device of the present invention further has first external electrodes electrically connected to said second circuit pattern and second external electrodes electrically connected to the first circuit pattern through the first and second through holes.

BRIEF DESCRIPTION OF THE DRAWINGS

These and other features and advantages of the invention will be further understood from the following detailed description of the preferred embodiment with reference to the accompanying drawings in which:

FIG. 1(*b*) is a plan view showing a first circuit pattern of the first embodiment.

FIG. 1(*c*) is a plan view showing a second circuit pattern of the first embodiment.

FIG. 5(*b*) is a plan view showing a first circuit pattern of the second embodiment.

FIG. 5(*c*) is a plan view showing a second circuit pattern of the second embodiment.

FIG. 6(*b*) is a top view of the semiconductor device according to the third embodiment of the present invention.

DETAILED DESCRIPTION OF THE PREFERRED EMBODIMENTS

Figure 1A:
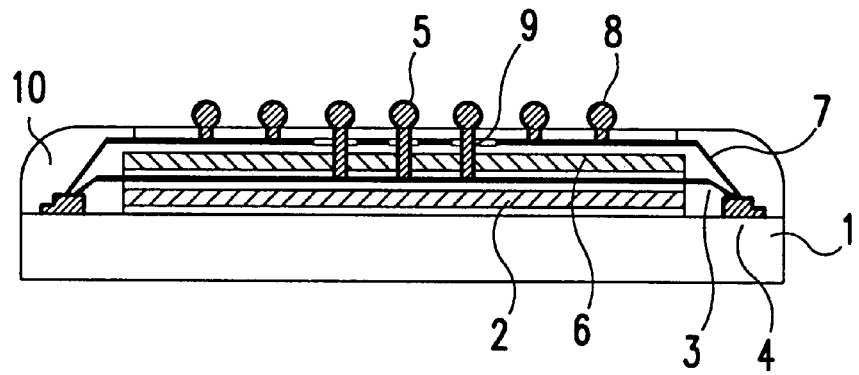
FIG. 1(*a*) is a sectional view of a semiconductor device showing a first embodiment of the present invention.
Figure 1B:
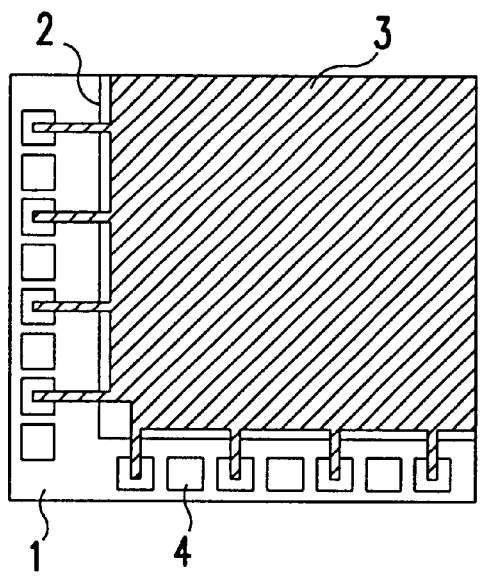
Figure 1C:
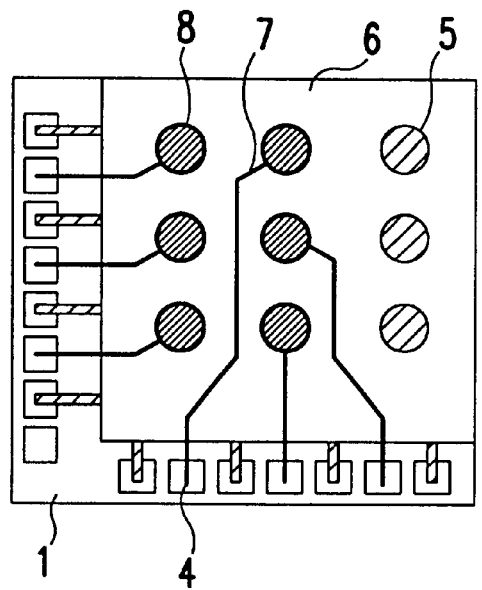
Figure 2A:
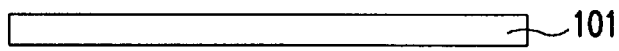
FIGS. 2(*a*) through 2(*e*) are sectional views showing the first method of manufacturing the circuit pattern.
Figure 2B:
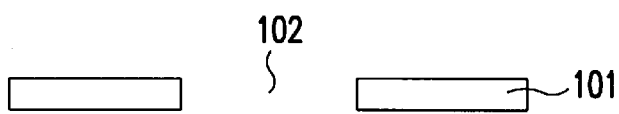
Figure 2C:
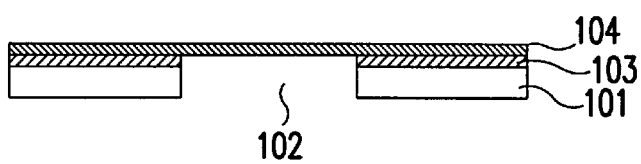
Figure 2D:
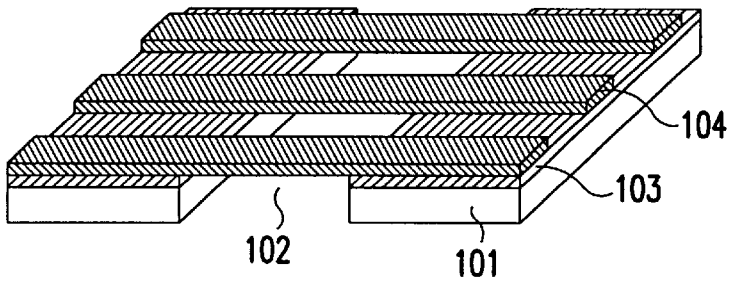
Figure 2E:
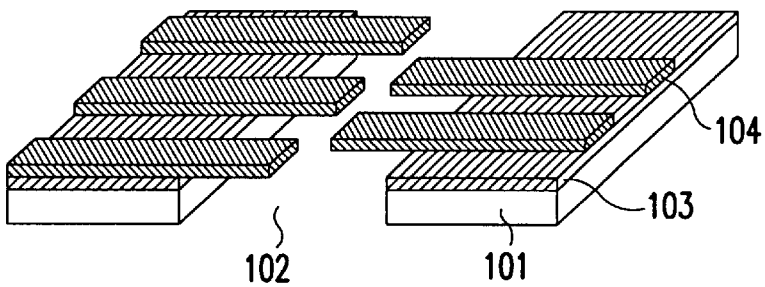
Figure 3A:
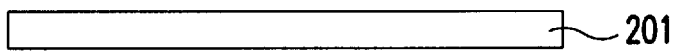
FIGS. 3(*a*) through 3(*f*) are sectional views showing the second method of manufacturing the circuit pattern.
Figure 3B:
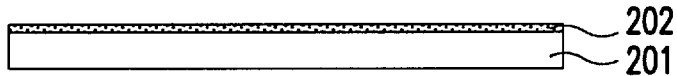
Figure 3C:
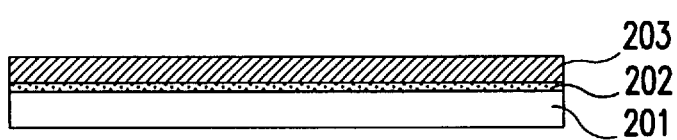
Figure 3D:
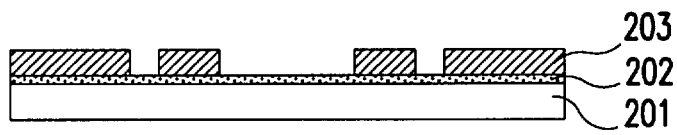
Figure 3E:
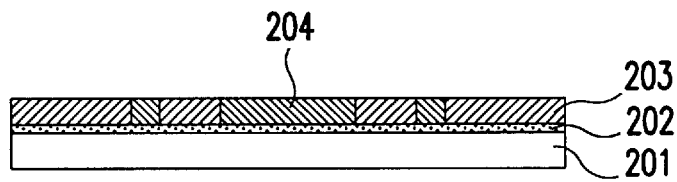
Figure 3F:
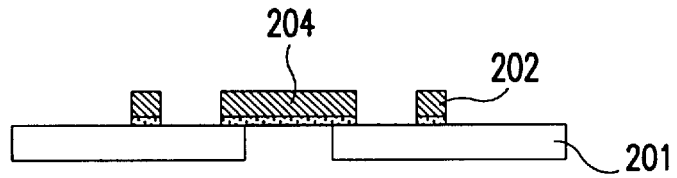

FIG. 1(*a*) is a sectional view of a semiconductor device showing a first embodiment of the present invention. FIG. 1(*b*) is a plan view showing a first circuit pattern and FIG. 1(*c*) is a plan view showing a second circuit pattern.

As shown in FIG. 1(*a*), a first insulation layer 2 on both surfaces of which paste is coated, is formed on and adhered to a circuit formation area of a semiconductor element 1. An integrated circuit is formed in the circuit formation area of the semiconductor element 1. A first circuit pattern 3 is formed on the first insulation layer 2. The first circuit pattern 3 is electrically connected to an pad electrode 4 formed on the semiconductor element 1 at a peripheral area (an electrode formation area) thereof and to a first external electrode 5 at a central area of the element 1. A second insulation layer 6 having a through hole 9 is formed on the first circuit pattern 3. A second circuit pattern 7 having the through hole 9 is formed on the second layer 6. The second circuit pattern 7 is electrically connected to the pad electrode 4 at the peripheral area of the element 1 and to a second external electrode 8 at the central area of the element 1. Finally, the above structure is covered by a mold resin 10.

As shown in FIG. 1(*b*), the first insulation layer 2 is formed and bonded on the circuit-formed area of the semiconductor element 1. The first pattern 3 is formed on the first insulation layer 2. The first pattern 3 is electrically connected to the pad electrode 4 formed on the peripheral area of the semiconductor element 1. The through hole 9 is formed in the second insulation layer 6 (not shown in FIG. 1(*c*)). The first pattern 3 is formed in the shape of plane and acts as a common pattern for a power supply or ground.

In a similar way, the second insulation layer 6 is formed on the first pattern 3 as shown in FIG. 1(*c*). The second pattern 7 is formed on the second layer 6. The second pattern 7 is connected to the pad electrode 4 formed on the peripheral area of the semiconductor element 1. As shown in FIG. 1(*c*), the first circuit pattern 3 and the second Circuit pattern 7 are alternately connected to the pad electrodes 4.

A semiconductor device having a multilayer structure according to the first embodiment described above increases a number of degrees of freedom in design work and improves heat radiation efficiency. Also the multilayer improves electrical characteristics and makes it easier to increase number of pins.

Next, a first method of manufacturing the circuit pattern is explained.

FIGS. 2(*a*) through 2(*e*) show the first method of manufacturing the circuit pattern. As shown in FIG. 2(*a*), an insulating layer 101 formed of polyimide is provided. A through hole 102 having a predetermined shape is formed by punching or drilling through the insulation layer 101 as shown in FIG. 2(*b*). Then, an adhesive material 103 is formed on the top surface of the insulating layer 101. A metal layer 104 such as copper leaf or gold leaf is pasted by the adhesive material 103 as shown in FIG. 2(*c*). Plating may be conducted in case it is needed. The metal layer 104 may extend beyond the through hole 102 as shown in FIG. 2(*d*) or extend from one side of the through hole 102 to the center portion of the through hole 102 as shown in FIG. 2(*e*).

FIGS. 3(*a*) through 3(*f*) show another (a second) method of manufacturing the circuit pattern. As shown in FIG. 3(*a*), an insulating layer 201 formed of polyimide is formed on the first circuit pattern 3, not shown in FIG. 3(*a*). As shown in FIG. 3(*b*), an evaporation metal layer 202 is formed on the insulating layer 201 by evaporation. Then, a resist layer 203 is formed on the evaporation metal layer 202 as shown in FIG. 3(*c*). A predetermined portion of the resist layer is removed as shown in FIG. 3(*d*). Then, the structure disclosed in FIG. 3(*d*) is subjected to be plated with metal 204 such as gold or copper as shown in FIG. 3(*e*). Finally, the resist layer 203, an undesired portion of the evaporation metal layer 202 and an undesired portion of the insulating layer 201 is removed as shown in FIG. 3(*f*).

Figure 4A:
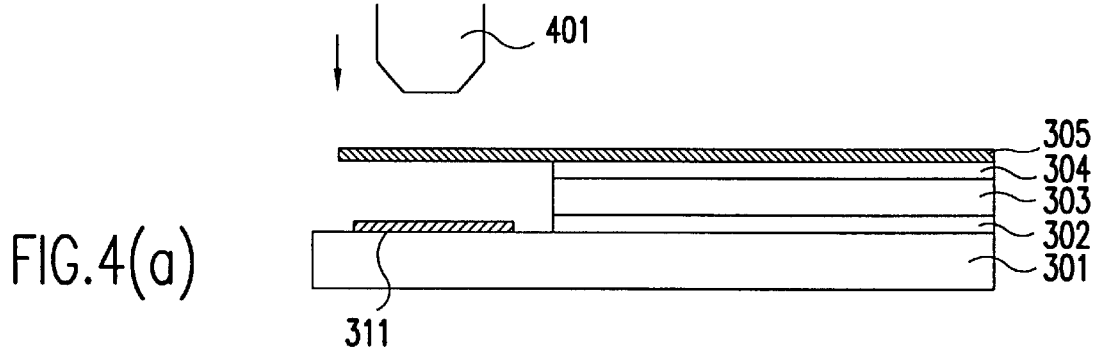
FIGS. 4(*a*) and 4(*b*) are sectional views of a semiconductor device showing a method of connecting the circuit pattern to the semiconductor device.
Figure 4B:
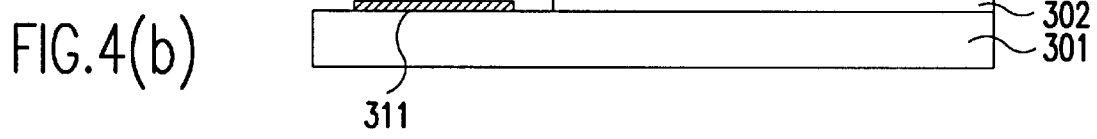

Turning to FIGS. 4(*a*) and 4(*b*), a method of connecting the circuit pattern to the semiconductor device will be explained.

A pad electrode 311 is formed on a semiconductor device 301. Further, a first adhesive layer 302, an insulating layer 303, a second adhesive layer 304 and a circuit pattern 305 is formed on the semiconductor device 301 in that order. The circuit pattern 305 is protruded over the pad electrode 311 as shown in FIG. 4(*a*).

The protruded portion of the circuit pattern 305 is pushed to the pad electrode 311 by a bonding tool 401. The circuit pattern 305 and the pad electrode 311 is connected by using load, heat and supersonic waves as shown in FIG. 4(*b*).

Figure 5A:
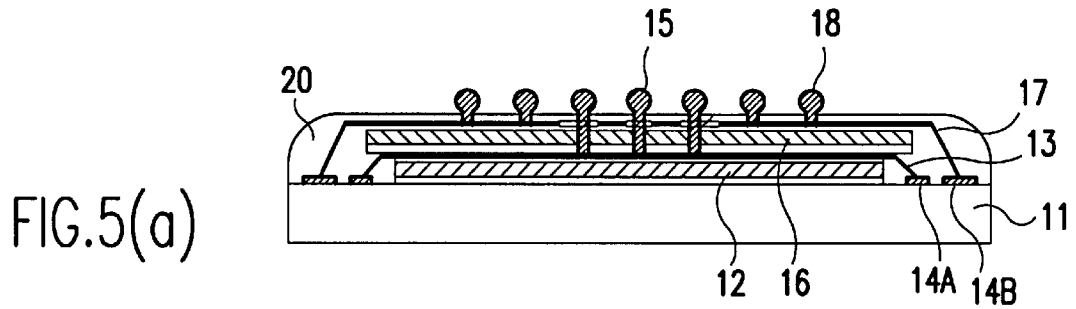
FIG. 5(*a*) is a sectional view of a semiconductor device showing a second embodiment of the present invention.
Figure 5B:
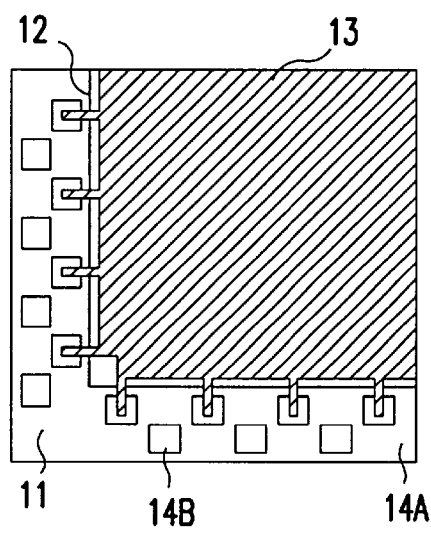
Figure 5C:
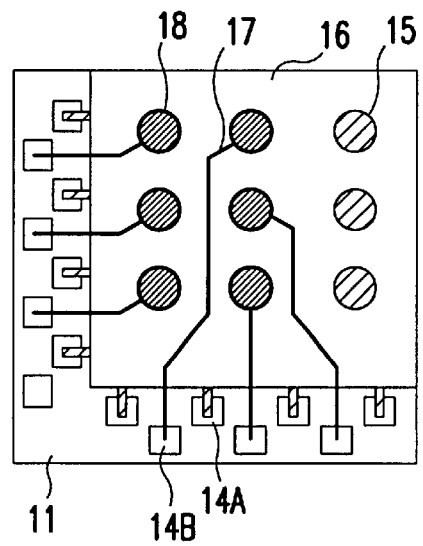

FIG. 5(*a*) is a sectional view of a semiconductor device showing a second embodiment of the present invention. FIG. 5(*b*) is a plan view showing a first circuit pattern of the second embodiment and FIG. 5(*c*) is a plan view showing a second circuit pattern of the second embodiment.

In the second embodiment, a first insulating layer 12, a first circuit pattern 13, a second insulation layer 16, a second circuit pattern 17 and the mold resin 20 is formed as shown in FIG. 5(*a*) in the same manner as described in the first embodiment. However, as shown in FIG. 5(*a*), the first pad electrode 14A and a second pad electrode 14B are formed on the semiconductor element 11 in two rows. The first circuit pattern 13 is connected to the first pad electrode 14A (a pad electrode aligned inside) as shown in FIGS. 5(*a*) and 5 (*b*). The second circuit pattern 17 is connected to the second pad electrode 14B (a pad electrode aligned outside) as shown in FIGS. 5(*a*) and 5(*c*). Further, the first circuit pattern 13 (or the first insulation layer 12) is smaller than the second circuit pattern 17 (or the second insulation layer 16).

When the semiconductor device having the above structure is operated, electric voltage is supplied with the first pad electrode 14A through the external pad electrode 15 and the first circuit pattern 13 and also with the pad electrode 14B through the external electrode 18 and the second circuit pattern 17.

According to the second embodiment described above, the first insulation layer 12 is formed smaller than the second insulation layer 16. Therefore circuit patterns can be easily connected to pad electrodes especially when pad electrodes 14A and 14B are aligned in two rows. As the result, reliability is improved.

Figure 6A:
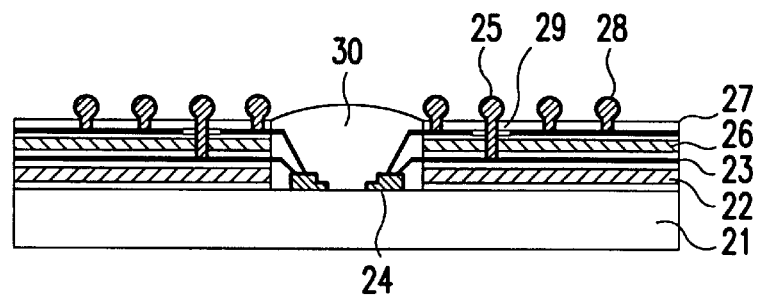
FIG. 6(*a*) is a sectional view of a semiconductor device showing a third embodiment of the present invention.
Figure 6B:
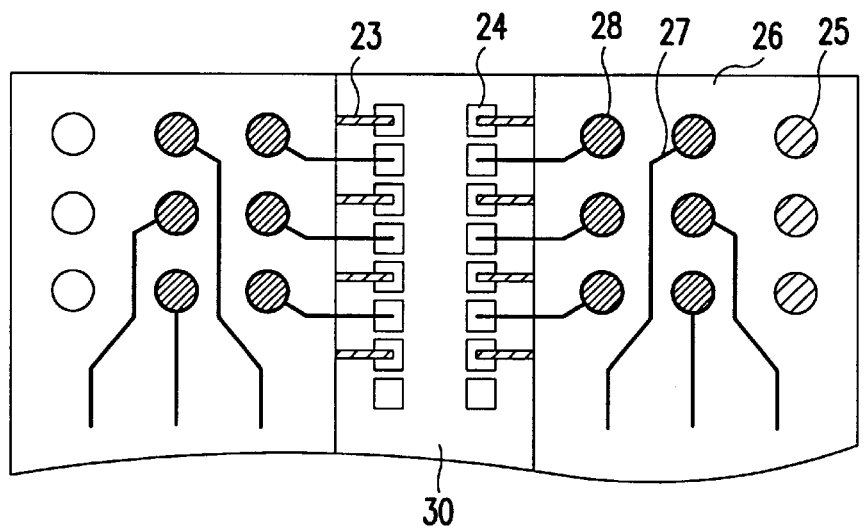

FIG. 6(*a*) is a sectional view of a semiconductor device showing a third embodiment of the present invention. FIG. 6(*b*) is a top view of the semiconductor device according to the third embodiment of the present invention.

The first insulation layer 22 is formed on the circuit formation area of the semiconductor element 21 excluding the center of the semiconductor element 21 where the pad electrodes 24 are located. The first circuit pattern 23 is formed on the first insulation layer 22. The second insulation layer 26 is formed on the first circuit pattern 23. The through-hole 29 is formed in the second insulation layer 26. The first circuit pattern 23 is electrically connected to the pad electrodes 24 at the center of the semiconductor element 21 and to the external electrode 25 at the circuit formation area of the semiconductor element 21.

In a similar way, the second insulation layer 26 is formed on the first circuit pattern 23. The second circuit pattern 27 is formed on the second insulation layer 26. The second circuit pattern 27 is electrically connected to pad electrodes 24 at the center of the semiconductor element 21 and to the external electrode 28 at the circuit formation area of the semiconductor element 21. The semiconductor element 21 is finally covered by the mold resin 30.

When the semiconductor device having the above structure is operated, electric voltage is supplied with the pad electrodes 24 through the external electrode 25 and the first circuit pattern 23 and also with the pad electrodes 24 through the external electrode 28 and the second circuit pattern 27.

According to the third embodiment described above, a multilayer structure can be constructed without forming the insulation layers in the center of the semiconductor element 21. A semiconductor device having such structure can correspond to the semiconductor element 21 having pad electrodes in the center thereof. As the result, electrical characteristics are improved.

Figures 7A, 7B:
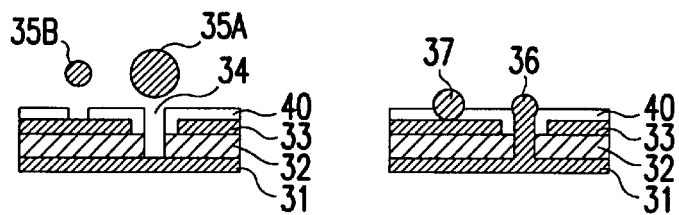
FIGS. 7(*a*) and 7(*b*) are partly diagrammatic sectional views of a semiconductor device showing a fourth embodiment of the present invention.

FIGS. 7(*a*) and 7(*b*) are partly diagrammatic sectional views of a semiconductor device showing a fourth embodiment of the present invention.

As shown in FIG. 7(*a*), solder balls 35A and 35B are mounted on predetermined positions where a first circuit pattern 31 is exposed, a first insulation layer 32 is removed to expose the first circuit pattern 31, a second circuit pattern 33 is removed and covered by mold resin 40 and a through-hole 34 for a first external electrode 36 are formed in advance. The solder balls 35A and 35B are melted by heating so that the solder ball 35A is connected to the first pattern 31 and the solder ball 35B is connected to the second pattern 33. As the result, as shown in FIG. 7(*b*), the external electrode 36 for the first pattern 31 and an external electrode 37 for the second pattern 33 are formed. In this case, the solder ball 35A must be bigger than the solder ball 35B (35A>35B), namely the solder ball 35A is bigger by a volume approximately equivalent to a volume of the through-hole 34.

When forming the external electrodes 36 and 37 by melting the solder balls 35A and 35B, the solder ball 35A melted by heat is flown into the through-hole 34 and connected to the first pattern 31 to form the external electrode 36. Therefore, the external electrode 36 becomes as big as the external electrode 37.

According to the fourth embodiment described above, the solder ball 35A is bigger than the solder ball 35B by a volume equal to a volume of the through-hole 34 to make the external electrode 36 as big as the external electrode 37. As a result, a semiconductor device can be provided with stable soldering.

As many different embodiments of this invention may be made without departing from the spirit and scope thereof, it is to be understood that the invention is not limited to the specific embodiment thereof.

What is claimed is:

1. A method of manufacturing a semiconductor device, comprising:

providing a semiconductor chip having a top surface and a bottom Surface opposite the top surface, wherein the top surface includes a circuit formation area and an electrode formation area, wherein the circuit formation area includes an integrated circuit, and wherein the electrode formation area includes a plurality of pad electrodes, said plurality of pad electrodes including a first pad electrode having a potential level applied thereto and a second pad electrode which receives a signal;

forming a first insulation layer on the circuit formation area;

forming a first Circuit pattern on the first insulation layer;

forming a second insulation layer on the first circuit pattern having a first through hole for exposing the first circuit pattern;

forming a second circuit pattern on the second insulation layer having a second through hole for exposing the first circuit pattern;

connecting the first circuit pattern to the first pad electrode and the second circuit pattern to the second pad electrode; and forming a plurality of first external electrodes electrically connected to said second circuit pattern and a plurality of second external electrodes electrically connected to said first circuit pattern through the first and second through holes.

2. The method of manufacturing a semiconductor device according to claim 1, wherein said forming the first circuit pattern includes coating adhesive materials on a top surface of the first insulation layer and placing metal leaf on the adhesive material to form the first circuit pattern.

3. The method of manufacturing a semiconductor device according to claim 1, wherein said forming the second circuit pattern includes:

evaporating metal on the second insulation layer to form an evaporation metal layer;

forming a resist layer on the evaporation metal layer;

removing a predetermined portion of the resist layer to obtain a resultant structure;

plating the resultant structure with metal; and removing the resist layer and an undesired portion of the evaporation metal layer.

4. The method of manufacturing a semiconductor device according to claim 1, wherein the first and second circuit patterns are connected to the first and second pad electrodes, respectively, by protruding the first and second circuit patterns over the respective first and second pad electrodes, and pushing the first and second circuit patterns into contact with the respective first and second pad electrodes using a bonding tool.

5. The method of manufacturing a semiconductor device according to claim 1, wherein said forming the external electrodes includes:

positioning solder balls on the second through hole and predetermined positions where the second circuit pattern is exposed;

melting the solder balls by heating so that the first and second external electrodes are formed.

6. The method of manufacturing a semiconductor device according to claim 5, wherein the solder balls positioned on the second through hole are bigger than the solder balls positioned on the predetermined positions.

7. A method of manufacturing a semiconductor device, comprising:

providing a semiconductor chip having a top surface and a bottom surface opposite the top surface, wherein the top surface includes a circuit formation area and an electrode formation area. wherein the circuit formation area includes an integrated circuit. and wherein the electrode formation area includes a plurality of pad electrodes;

forming a first insulation layer on an entirety of the circuit formation area;

forming a first circuit pattern on the first insulation layer so as to overlap the entirety of the circuit formation area;

electrically connecting the first circuit pattern to one of the pad electrodes;

forming a second insulation layer on the first circuit pattern, the second insulation layer having a through hole for exposing the first circuit pattern;

forming a plurality of second circuit patterns on the second insulation layer, electrically connecting each of the second circuit patterns to a respective one of the pad electrodes;

forming a first external electrode on the first circuit pattern through the through hole, and forming a plurality of second external electrodes on the second insulation layer so as to electrically connect to one of the second circuit patterns, respectively.

8. The method of manufacturing a semiconductor device according to claim 7, wherein each of the second circuit patterns is electrically connected to a respective one of the pad electrodes by using a bonding tool.

9. The method of manufacturing a semiconductor device according to claim 7, wherein the circuit formation area is located in a center of the top surface of the semiconductor chip and wherein the electrode formation area is located in a peripheral of the top surface of the semiconductor chip.

10. The method of manufacturing a semiconductor device according to claim 7, wherein the second insulation layer occupies an area which is larger than that of the first circuit pattern.

11. The method of manufacturing a semiconductor device according to claim 7, wherein the circuit formation area is located at the both sides of the top surface of the semiconductor chip and wherein the electrode formation area is located between the circuit formation area.

* * * * *